US010329142B2

(12) United States Patent
Lee et al.

(10) Patent No.: US 10,329,142 B2
(45) Date of Patent: Jun. 25, 2019

(54) WAFER LEVEL PACKAGE AND METHOD OF MANUFACTURING THE SAME

(71) Applicant: SAMSUNG ELECTRO-MECHANICS CO., LTD., Suwon-si (KR)

(72) Inventors: Moon Chul Lee, Suwon-si (KR); Duck Hwan Kim, Suwon-si (KR); Yeong Gyu Lee, Suwon-si (KR); Jae Chang Lee, Suwon-si (KR); Tae Yoon Kim, Suwon-si (KR); Kyong Bok Min, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/091,057

(22) Filed: Apr. 5, 2016

(65) Prior Publication Data

US 2017/0174503 A1    Jun. 22, 2017

(30) Foreign Application Priority Data

Dec. 18, 2015  (KR) .......................... 10-2015-0181485

(51) Int. Cl.
*B81B 7/00* (2006.01)
*B81C 1/00* (2006.01)
*H01L 23/00* (2006.01)

(52) U.S. Cl.
CPC .......... *B81B 7/007* (2013.01); *B81C 1/00269* (2013.01); *H01L 23/00* (2013.01); *B81B 2201/0271* (2013.01); *B81B 2203/0315* (2013.01); *B81C 2203/0118* (2013.01)

(58) Field of Classification Search
CPC ...... B81C 1/00269; B81B 7/007; H01L 23/00
See application file for complete search history.

(56) References Cited

U.S. PATENT DOCUMENTS

| 4,878,988 A | * | 11/1989 | Hall | ........................ C30B 33/00 257/E21.318 |
| 5,597,767 A | * | 1/1997 | Mignardi | ............ B81C 1/00873 148/DIG. 12 |
| 5,690,749 A | * | 11/1997 | Lee | ........................ B08B 7/0028 134/26 |

(Continued)

FOREIGN PATENT DOCUMENTS

| JP | 2007-242699 A | 9/2007 |
| JP | 2011-522409 A | 7/2011 |
| KR | 10-2013-0137039 A | 12/2013 |

OTHER PUBLICATIONS

Chinese Office Action dated Aug. 20, 2018 in corresponding Chinese Patent Application No. 201610264180.3 (11 pages in English and 8 pages in Chinese).

*Primary Examiner* — Allen L Parker
*Assistant Examiner* — Charles N Ausar-El
(74) *Attorney, Agent, or Firm* — NSIP Law

(57) ABSTRACT

A wafer level package includes a wafer member having inner cavities in which circuit elements are disposed, element wall members disposed on an internal surface of the wafer member and enclosing element sections in which the circuit elements are disposed, and clearance wall members disposed on external surfaces of the element wall members and dividing a space between the element sections into clearance sections.

18 Claims, 5 Drawing Sheets

(56) References Cited

U.S. PATENT DOCUMENTS

| | | | |
|---|---|---|---|
| 5,872,046 A * | 2/1999 | Kaeriyama | H01L 21/02052 257/E21.228 |
| 6,479,320 B1 * | 11/2002 | Gooch | B81B 7/007 438/106 |
| 6,867,060 B2 * | 3/2005 | Greathouse | B81C 1/00269 438/51 |
| 7,683,478 B2 * | 3/2010 | Chen | H01L 25/50 257/723 |
| 7,936,062 B2 * | 5/2011 | Humpston | B81C 1/00269 257/680 |
| 7,952,189 B2 * | 5/2011 | Wan | B81C 1/00269 257/704 |
| 8,435,885 B2 * | 5/2013 | Chumakov | G01N 1/04 438/645 |
| 8,551,814 B2 * | 10/2013 | Karlin | B81B 7/007 257/733 |
| 8,975,736 B2 * | 3/2015 | Okuno | H01L 21/50 257/684 |
| 2002/0000646 A1 | 1/2002 | Gooch et al. | |
| 2003/0116825 A1 * | 6/2003 | Geefay | B81B 7/0077 257/619 |
| 2004/0195669 A1 * | 10/2004 | Wilkins | B81B 7/0006 257/698 |
| 2006/0266383 A1 * | 11/2006 | Tran | H01L 21/6708 134/34 |
| 2007/0190691 A1 | 8/2007 | Humpston et al. | |
| 2007/0228010 A1 * | 10/2007 | Martin | H01L 21/02087 216/83 |
| 2008/0032484 A1 * | 2/2008 | Diep | B81C 1/00269 438/455 |
| 2008/0113470 A1 * | 5/2008 | Nystrom | B81C 1/00269 438/106 |
| 2009/0001522 A1 * | 1/2009 | Wu | H01L 23/562 257/622 |
| 2009/0075431 A1 * | 3/2009 | Warren | B81C 1/00333 438/126 |
| 2009/0194861 A1 * | 8/2009 | Bonse | B81C 1/00333 257/690 |
| 2009/0224851 A1 * | 9/2009 | Feiertag | H03H 9/059 333/186 |
| 2010/0283144 A1 * | 11/2010 | Liang | B81B 7/0077 257/737 |
| 2011/0012214 A1 * | 1/2011 | Beer | B81C 1/00333 257/418 |
| 2011/0114355 A1 | 5/2011 | Bauer et al. | |
| 2012/0193133 A1 * | 8/2012 | Eaves | H01L 23/10 174/262 |
| 2012/0205821 A1 * | 8/2012 | Tan | H01L 23/26 257/787 |
| 2013/0087379 A1 * | 4/2013 | Grama | H03H 9/1014 174/546 |
| 2014/0111062 A1 | 4/2014 | Bauer et al. | |
| 2014/0353775 A1 * | 12/2014 | Formosa | B81C 1/00238 257/415 |
| 2015/0021721 A1 * | 1/2015 | Romig | B81C 1/00269 257/416 |
| 2016/0343629 A1 * | 11/2016 | Rajoo | H01L 24/29 |
| 2017/0047308 A1 * | 2/2017 | Ho | H01L 25/0652 |

* cited by examiner

WAFER LEVEL PACKAGE AND METHOD OF MANUFACTURING THE SAME

CROSS-REFERENCE TO RELATED APPLICATION

This application claims the benefit under 35 USC 119(a) of Korean Patent Application No. 10-2015-0181485 filed on Dec. 18, 2015, in the Korean Intellectual Property Office, the entire disclosure of which is incorporated herein by reference for all purposes.

BACKGROUND

1. Field

The following description relates to a wafer level package and a method of manufacturing the same.

2. Description of Related Art

With the recent trend for the miniaturization of semiconductor elements, interest in wafer-level packaging technology has increased. Wafer-level packaging technology refers to a semiconductor package technology involving packaging a wafer in which chips are not separated, unlike an existing scheme of separating chips from a wafer and packaging the individual chips cut from the wafer. In a wafer-level packaging method, the dicing of individual chips may occur after the packaging of the wafer.

Manufacturing a semiconductor device generally involves four separate processes, including a circuit design process, a wafer processing process, an assembly process and a testing process. Among these processes, the assembly process involves a wiring connection process and a package process. These processes involve a scheme of cutting individual chips from a wafer on which processing has been finished, attaching each of the individual chips to a small circuit board, connecting wirings, and then covering the small circuit board with a plastic package.

However, in a wafer-level packaging scheme, the package process is performed by a simple procedure of coating a photosensitive insulating material on a wafer, instead of applying a plastic as a package material on individual chips, connecting wirings, and reapplying an insulating material.

When the package technology as described above is applied, semiconductor assembly processes such as a wiring connection process and a plastic package process are shortened. In addition, a plastic packaging material, a circuit board, a wire for a wiring connection, and the like, that have been used to assemble a semiconductor in the related art are not required, such that manufacturing costs may be significantly reduced.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a wafer level package includes a wafer member having inner cavities in which circuit elements are disposed, element wall members disposed on an internal surface of the wafer member and enclosing element sections in which the circuit elements are disposed, and clearance wall members disposed on external surfaces of the element wall members and dividing a space between the element sections into clearance sections.

The wafer member may include a cap wafer and a device wafer coupled to the cap wafer to form the inner cavities, and the clearance wall members may protrude from an internal surface of at least one of the cap wafer and the device wafer.

The clearance wall members may protrude from the internal surface of the wafer member and may form a stepped shape.

The clearance wall members may protrude from the internal surface of the wafer member and may form a tapered shape.

The element wall members enclosing the circuit elements may have a prismatic shape.

The circuit elements may be disposed in respective element sections, and the respective circuit elements may be connected to the element wall members.

At least one of the circuit elements may correspond to a bulk acoustic wave (BAW) resonator.

In another general aspect, a method of manufacturing a wafer level package involves manufacturing a device wafer and a cap wafer by forming element wall members and clearance wall members, the element wall members forming boundaries of element sections that enclose circuit elements, and the clearance wall members being disposed on external surfaces of the element wall members to enclose clearance sections in spaces between the element sections; and bonding the device wafer and the cap wafer to each other with a bonding material so that the circuit elements are disposed inside a combined structure of the device wafer and the cap wafer.

The general aspect of the method may further involve dicing the device wafer and the cap wafer along the clearance sections.

In another general aspect, a wafer level package includes a first wafer and a second wafer with a space therebetween, first wall members that allocate a portion of the space as element sections, the element sections including one or more circuit elements, and second wall members that divide a portion of the space external to the element sections as clearance sections.

The portion of the space external to the element sections may include a clearance area on the device wafer where no circuit elements are disposed.

The first wall members may hermetically seal each element sections, and the second wall members may seal each clearance sections.

At least a portion of the first wall members and at least a portion of the second wall members may be formed integrally with either the device wafer or the cap wafer.

A first portion of the first wall members and a first portion of the second wall members may be formed to protrude from the cap wafer. A second portion of the first wall members and a second portion of the second wall members may be formed to protrude from the device wafer. The first portions of the first wall members and the first portions of the second wall members may be, respectively, bonded to the second portions of the first wall members and the second portion of the second wall members to seal the element sections and the clearance sections.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
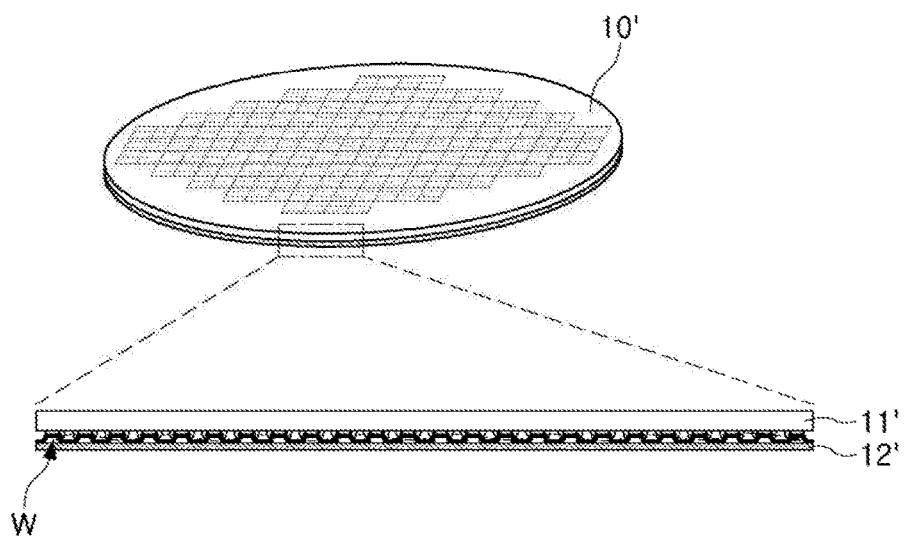
FIG. 1 includes views of a wafer level package.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present description. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, various embodiments will be described with reference to schematic views. In the drawings, for example, due to manufacturing techniques and/or tolerances, modifications of the shape shown may be estimated. Thus, the following description should not be construed as being limited to the shapes of regions shown herein, and, for example, be understood to include a change in shape results in manufacturing. The following embodiments may also be constituted by one or a combination thereof.

The contents of the following description may have a variety of configurations and propose only a required configuration herein, but are not limited thereto.

As noted above, a wafer-level packaging technique involves packaging a semiconductor device or an integrated circuit while it is still a part of a wafer. However, referring to FIG. 1, when a wafer-level packaging method is performed on a wafer, foreign objects w may be generated during various processes of the packaging scheme. For example, foreign objects w may be generated during the process of forming via holes, the process of depositing a wiring, and the like. The foreign objects w generated as described above may damage the circuit elements disposed in an internal portion of a wafer member 10' to which a cap wafer 11' and a device wafer 12' are bonded and coupled by being introduced into the internal portion of the wafer member 10', as illustrated in FIG. 1, thereby generating a defective product.

Because there is no obstacle for the introduction of the foreign objects w in the internal portion of the wafer member 10', the foreign objects w may move into the internal portion of the wafer member 10'. Therefore, once the foreign objects w are introduced into the wafer member 10', circuit elements in the internal portion of the wafer member 10' are damaged, such that defective products are obtained.

Therefore, a method of manufacturing a wafer-level package that improves product reliability and yield is sought.

Various examples of wafer level packages and methods of manufacturing the same are suggested in the present disclosure in order to prevent circuit elements E in an internal portion of a wafer member 10 from being damaged even in the case that foreign objects w are introduced to the wafer member 10.

According to one example of a wafer level package and a method of manufacturing the same, clearance wall members 30 may be provided. Therefore, even in the event that foreign objects w are generated in the wafer member 10 or are introduced into an internal portion of the wafer member 10, the foreign objects w may reach only some regions and not enter other regions of the wafer member 10. As a result, a scenario in which foreign objects w contaminates a large portion of the wafer member 10 by moving through the entire wafer member 10 may be prevented.

Figure 2:
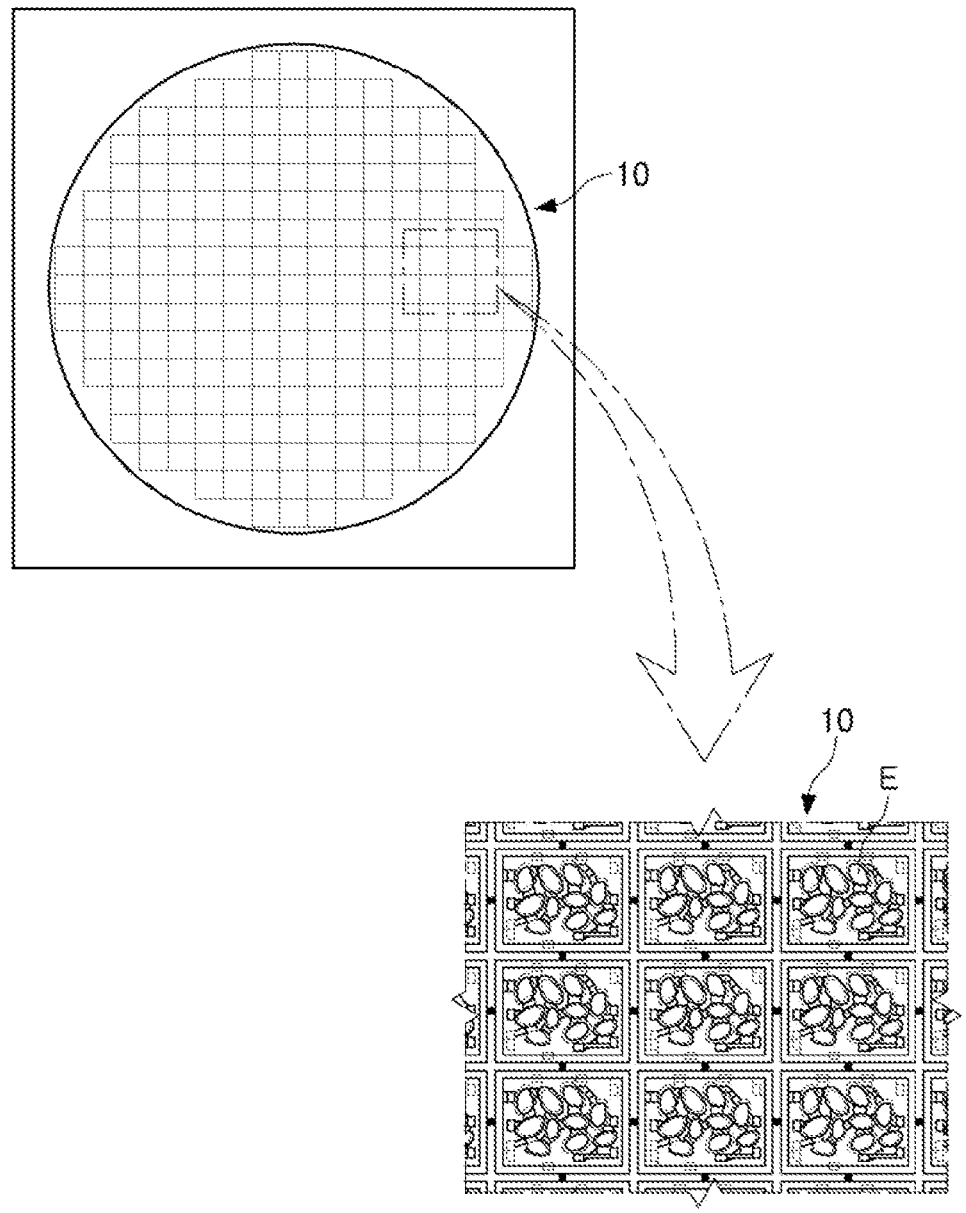
FIG. 2 includes a plan view of an example of a wafer level package according to the present disclosure, and a plan view of an inner portion of the wafer level package.
Figure 3:
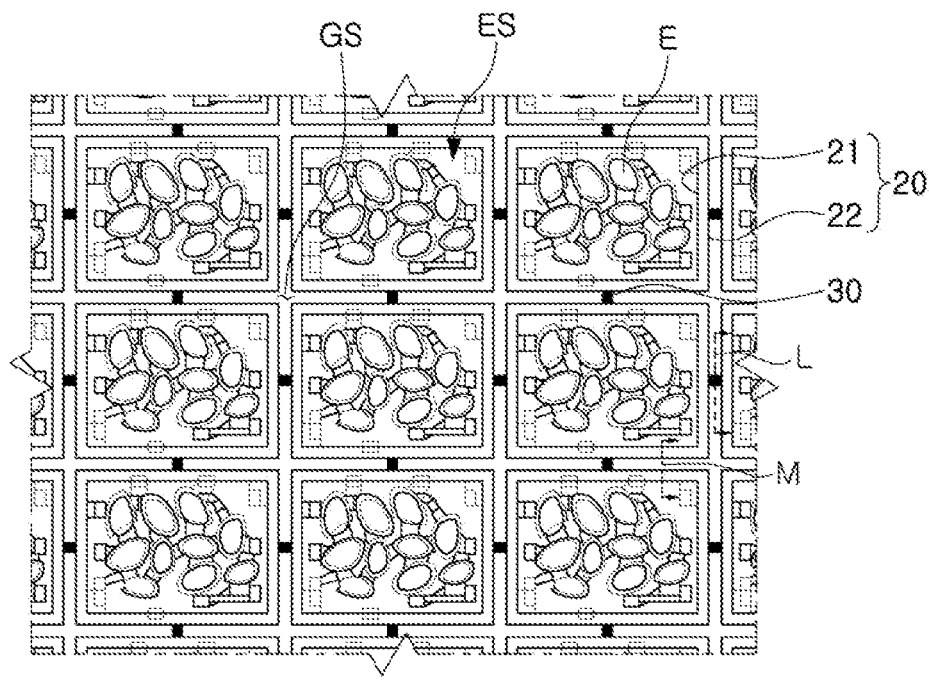
FIG. 3 is a plan view of an inner portion of an example of a wafer level package.

FIGS. 2 and 3 illustrate plan views of an internal portion of a wafer level package according to one embodiment. Referring to FIGS. 2 and 3, the wafer level package includes a wafer member 10 including circuit elements E provided in inner cavities of the wafer member 10 and element wall members 20 provided on an internal surface of the wafer member 10 and enclosing the circuit elements E in element sections ES. In this example, the element wall members 20 divide the wafer member 10 into a plurality of element sections ES. The circuit elements E are provided in the plurality of element sections ES. The wafer level package further includes the clearance wall members 30 provided on external surfaces 22 of the element wall members 20 and encloses a plurality of clearance sections GS that divide spaces between the plurality of element sections ES.

As described above, the illustrated wafer level package includes the wafer member 10, the element wall members 20, and the clearance wall members 30 in order to prevent the foreign objects w from freely moving in the internal portion of the wafer member 10 when the foreign objects w are introduced to the wafer member 10 or are generated in the internal portion of the wafer member 10.

The wafer member 10 may serve to package the circuit elements E in an internal portion thereof. To this end, the wafer member 10 may include a device wafer 12, a cap wafer 11, and the like.

In other words, the wafer member 10 may include the device wafer 12 including the element sections ES provided on an upper surface thereof and including the circuit elements E, the cap wafer 11, a bonding material B bonding and sealing the device wafer 12 and the cap wafer 11 to each other, getters, vias electrically connected to the element sections ES while penetrating through the cap wafer 11, respective external pads for external electrical connections of the vias, and the like.

In this example, the device wafer 12 includes a plurality of element sections ES and one or more internal pads provided on the upper surface thereof, wherein the element sections ES need to seal the circuit elements E, or the like, formed of an inter-digital transducer (IDT) electrode, and one or more internal pads are electrically connected to the circuit elements E of the element sections ES.

According to one example, the circuit element E may be a bulk acoustic wave (BAW) resonator, a surface acoustic wave (SAW) resonator, a microelectromechanical systems (MEMS) element, or the like.

The circuit element E of the wafer level package may be, for example, a bulk acoustic wave (BAW) resonator.

The bonding material B may be benzocyclobutene (BCB), dry film resin (DFR), epoxy, polymer such as thermosetting polymer, or a metal.

The cap wafer 11 is bonded to the device wafer 12 by the bonding material B, which is the polymer, and may include the getters provided on a lower surface thereof to correspond to the element sections ES of the device wafer 12 and formed of any one of barium, magnesium, zirconium, red phosphor, and titanium, thereby preventing absorption of moisture and permeation of the foreign objects w into the elements.

The vias may be connected to the internal pads provided on the upper surface of the device wafer 12 while penetrating through the cap wafer 11 and be connected to external pads provided on an upper surface of the cap wafer 11 to derive electrical signals from the circuit elements E of the element sections ES electrically connected to a plurality of internal pads or apply power to the circuit elements of the element sections ES.

The element wall members 20 may serve to enclose the element sections ES in which the circuit elements E are provided.

Outer portions of the element wall members 20 may have a plurality of closed curve shapes such as a circular shape, a quadrangular shape, or the like, in relation to the element sections ES, and internal portions of the element wall members 20 other than the outer portions of the element wall members 20 may enclose the respective vias.

Portions of the element wall members 20 enclosing the circuit elements E may be formed in a prismatic shape, such that more element regions may be formed, whereby a degree of integration of the circuit elements E may be improved.

In other words, the portions of the element wall members 20 of the wafer level package enclosing the circuit elements E may have the prismatic shape.

In this example, a plurality of circuit elements E are provided in each element sections ES of the wafer level package. The respective circuit elements E may be connected to the element wall members 20.

The clearance wall members 30 may serve to close clearance sections GS, provided as spaces between the element sections ES closed by the element wall members 20.

Because the clearance wall members 30 serve as obstacles in response to foreign objects w in the internal portion of the wafer member 10 moving around inside the wafer member 10, the clearance wall members 30 may prevent further contamination by the foreign objects w.

In other words, by providing the clearance wall members 30, it is possible to significantly reduce a defective rate of the circuit elements E due to the foreign objects w.

The reason is that only the circuit elements E in regions into which the foreign objects w are introduced or in which the foreign objects are generated are damaged, such that defects occur only in the circuit elements E in the above-mentioned regions, and the introduction of the foreign objects w into regions other than the above-mentioned regions is prevented.

To this end, the clearance wall members 30 is provided in the clearance sections GS. For example, the clearance wall members 30 may be coupled to the external surfaces 22 of the element wall members 20, which are opposite surfaces to inner wall surfaces 21 of the element wall members 20 on which the circuit elements E are provided.

In addition, the clearance wall members 30 may connect the external surfaces 22 of the element wall members 20 of the plurality of element sections ES to each other, thereby enclosing the clearance sections GS.

In addition, the clearance wall member 30 may protrude from an internal surface of the wafer member 10, as described below with reference to FIGS. 4 through 6.

Figure 4:
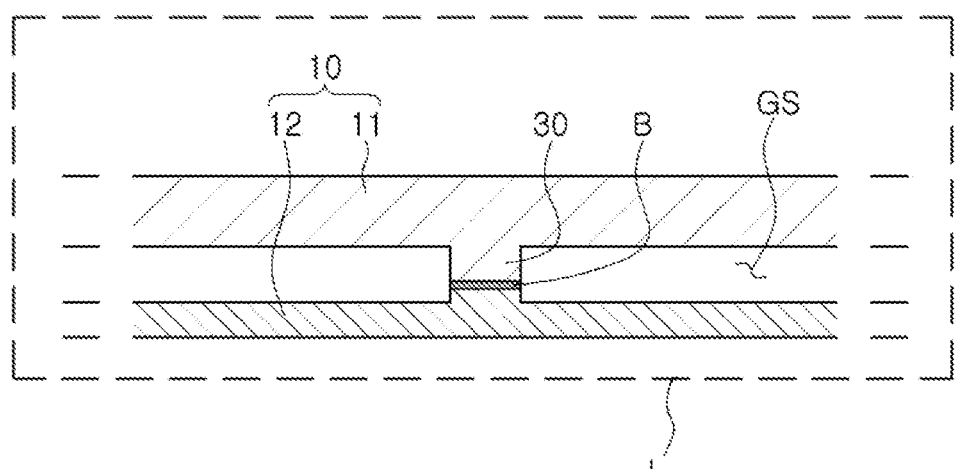
FIGS. 4 through 6 are side views illustrating clearance wall members in an example of a wafer level package.
Figure 5:
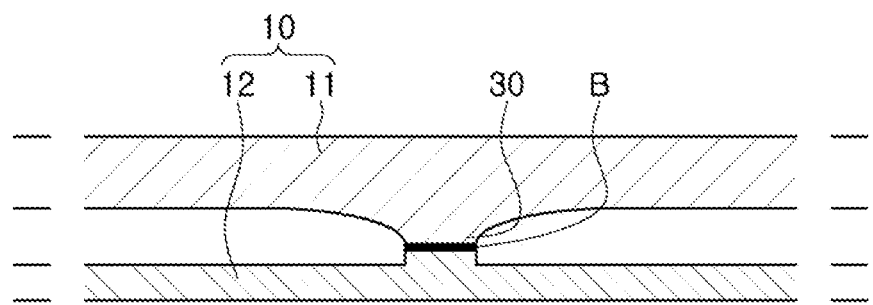
Figure 6:
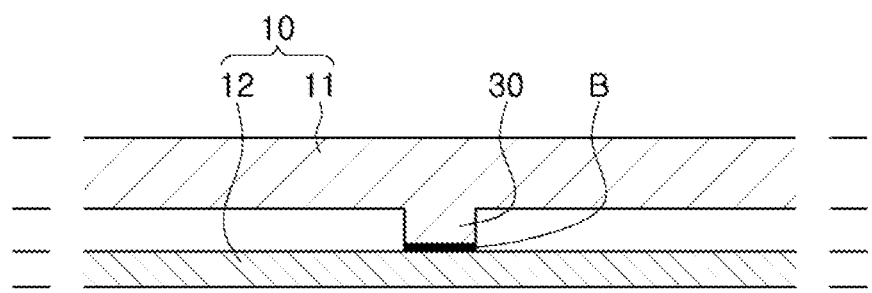

FIGS. 4 through 6 are side views illustrating examples of clearance wall members 30 in another example of a wafer level package. FIG. 4 illustrates an example in which a clearance wall member 30 has a stepped shape, and FIG. 5 illustrates an example in which a clearance wall member 30 has a tapered shape. FIG. 6 illustrates an example in which the clearance wall member 30 protrudes on only one of the cap wafer 11 and the device wafer 12.

Referring to FIGS. 4 through 6, a wafer member 10 of the wafer level package includes a cap wafer 11 provided on one side and a device wafer 12 coupled to the cap wafer 11 to form the inner cavities. The wafer member 10 further includes a clearance wall members 30 that protrudes from an internal surface of at least one of the cap wafer 11 and the device wafer 12.

In other words, the clearance wall members 30 may protrude from the internal surface of the wafer member 10, thereby enclosing the clearance sections GS.

The clearance wall members 30 that protrudes into the space of clearance sections GS may form a stepped shape, a tapered shape, or the like.

Figure 7:
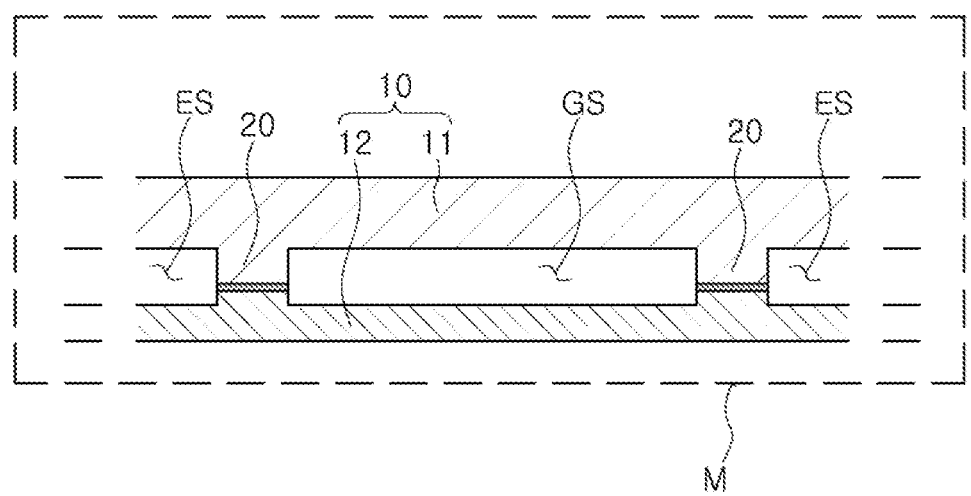
FIG. 7 illustrates a cross-sectional view of the clearance section ES alone line M of FIG. 3.

FIG. 4 corresponds to a cross-sectional view taken along line L of FIG. 3, and FIG. 7 illustrates a cross-sectional view of the clearance section ES along line M of FIG. 3. Referring to FIG. 4, the clearance wall members 30 of the wafer level package protrude from an internal surface of the wafer member 10, and form a stepped shape.

As described above, the clearance wall members 30 may protrude in a stepped shape, whereby the clearance wall members 30 may be easily manufactured.

Referring to FIG. 5, clearance wall members 30 of a wafer level package protrudes from an internal surface of the wafer member 10, and form a tapered shape.

As described above, the clearance wall members 30 may protrude in a tapered shape to sequentially reduce the impact energy generated by collision with foreign objects w, so that damages to the clearance wall members 30 due to the foreign objects w may be reduced, thereby preventing further diffusion of the foreign objects w.

In addition, referring to FIGS. 4 and 5, the clearance wall members 30 protrude from both of the cap wafer 11 and the device wafer 12 and be coupled to each other by a bonding material B on bonding surfaces of the clearance wall members 30 corresponding to each other. However, the arrangement of the clearance wall members 30 is not limited thereto. In another example illustrated in FIG. 6, the clearance wall members 30 protrude from only one of the cap wafer 11 and the device wafer 12 and are coupled to the cap wafer 11 or the device wafer 12 disposed at the other side by the bonding material B.

In this example, because the clearance wall members 30 are only formed on one of the cap wafer 11 and the device wafer 12, a time required for forming the clearance wall members 30 may be reduced, and a process of forming the clearance wall members 30 may be simplified.

In addition, according to another example, a method of manufacturing a wafer level package may be suggested.

Referring to FIG. 6, an example of a method of manufacturing a wafer level package involves manufacturing a device wafer 12 and a cap wafer 11 by forming element wall members 20 and clearance wall members 30 to protrude from an internal surface of the device wafer 12, the cap wafer 11 or both. In this example, the element wall members 20 enclose the element sections ES including the circuit elements E, and the clearance wall members 30 are provided on external surfaces 22 of the element wall members 20 to enclose the clearance sections GS, which are the spaces between the element sections ES. The method further involves bonding the device wafer 12 and the cap wafer 11 to each other by the bonding material B so that the circuit elements E are provided in the internal portion thereof.

In addition, according to another example, a method of manufacturing a wafer level package further includes dicing the device wafer 12 and the cap wafer 11 along the clearance sections GS.

During the manufacturing process of the device wafer 12 and the cap wafer 11, the element wall members 20 and the clearance wall members 30 may be provided such that they are arranged in a predesignated pattern in the wafer member 10.

In addition, in the bonding of the device wafer 12 and the cap wafer 11 to each other, the device wafer 12 includes one or more internal pads electrically connected to the circuit elements E and the element sections ES, which are provided on the upper surface thereof. The cap wafer 11 includes the getters mounted on the lower surface thereof to correspond to the element sections ES may be bonded to each other by the bonding material B such as the polymer, or the like. The bonding material B between the cap wafer 11 and the device wafer 12 may be hardened, thereby sealing the circuit elements of the element sections ES.

The circuit elements E of the element sections ES provided on the upper surface of the device wafer 12, which need to be mounted in a state in which they are sealed, may be, for example, the BAW resonators formed of the IDT electrode. In addition, the BAW resonators of the element sections ES may be electrically connected to one or more internal pads, respectively.

When the device wafer 12 and the cap wafer 11 are bonded to each other by the bonding material B such as polymer, or the like, in the bonding of the device wafer 12 and the cap wafer 11 to each other, the bonding material B may be benzocyclobutene (BCB), dry film resin (DFR), epoxy, a polymer such as a thermosetting polymer, a metal, or the like.

In addition, pollution of the BAW resonators of the element sections ES due to moisture or the foreign objects w generated in a process of bonding the device wafer 12 and the cap wafer 11 to each other may be prevented using the getters provided on the lower surface of the cap wafer 11.

After the device wafer 12 and the cap wafer 11 are bonded to each other by the bonding material B, first photo-resist patterns may be patterned on the upper surface of the cap wafer 11. In addition, via holes may be formed by etching, and may be connected to the internal pads, respectively.

In addition, as the etching process for forming the via holes, wet etching or dry etching may be performed. According to one embodiment, wet etching using photo-resist patterns may be performed to form the via holes up to the internal pads through the cap wafer 11 and the bonding material B. Alternatively, dry etching such as reactive ion etch (RIE) may be performed to form the via holes up to the internal pads through the cap wafer 11 and the bonding material B.

After the via holes are formed using the first photo-resist patterns, the via holes may be filled with a metal by a physical vapor deposition (PVD) method, and a chemical mechanical polishing (CMP) process may be performed to planarize the metal filled in the via holes and the upper surface of the cap wafer 11, thereby forming the vias.

For example, in the PVD method of forming the vias, which is, for example, a sputtering method, an electrically conductive metal such as Al, Cu, or the like, may be deposited to thereby be filled in the via holes exposing the internal pads.

After the CMP process is performed to form a plurality of planarized vias, a photo-resist may be patterned on the upper surface of the cap wafer 11 to form second photo-resist patterns. The external pads each connected to the vias may be formed by these second photo-resist patterns.

After the second photo-resist patterns are formed as described above, an electrically conductive metal may be deposited between the second photo-resist patterns by a PVD method, and a CPM process may be performed to planarize the upper surface of the cap wafer 11.

After the electrically conductive metal is deposited between the second photo-resist patterns and the CPM process is performed, an ashing process of removing the second photo-resist patterns and a cleaning process may be performed to form the external pads on the upper surface of the cap wafer 11.

In addition, after the external pads are formed on the upper surface of the cap wafer 11, the device wafer 12 and the cap wafer 11 may be diced along dicing lines A in order to separate the BAW resonators of the element sections ES in a package unit in which the BAW resonators of the element sections ES are sealed.

In other words, the device wafer 12 and the cap wafer 11 may be diced along the clearance sections GS, thereby providing the BAW resonators of the element sections ES sealed by the bonding material B.

Even though the foreign objects w are introduced to a space between the cap wafer 11 and the device wafer 12 in which the circuit elements E are provided in a process of manufacturing the wafer level package as described above, movement of the foreign objects w may be blocked by the clearance wall members 30, such that regions in which the circuit elements E are damaged due to the foreign objects w may be limited to regions into which the foreign objects w are introduced.

As set forth above, in the wafer level package and the method of manufacturing the same, the clearance wall members may be provided.

Therefore, even though the foreign objects w are introduced into the wafer member or are generated in the internal portion of the wafer member, the foreign object may move around within only some of regions, such that the likelihood that the foreign object w damages other portions of the wafer member by moving through the entire wafer member may be prevented.

Therefore, regions in which the circuit elements of the wafer member become defective products may be limited, such that a defective rate in producing circuit element products may be reduced.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A wafer level package comprising:
   a wafer member having inner cavities in which a circuit element is disposed;
   an element wall member extending vertically on an internal surface of the wafer member and enclosing an element section in which the circuit element is disposed, the element section spaced apart horizontally from an adjacent element section by a dicing space; and
   a clearance wall member extending horizontally from an external surface of the element section across the dicing space to an external surface of the adjacent element section to divide the dicing space between the element sections into clearance sections isolated each from the other.

2. The wafer level package of claim 1, wherein the wafer member comprises a cap wafer and a device wafer coupled to the cap wafer to form the inner cavities, and
   the clearance wall member protrudes from an internal surface of at least one of the cap wafer and the device wafer.

3. The wafer level package of claim 1, wherein the clearance wall member protrudes from the internal surface of the wafer member and forms a stepped shape.

4. The wafer level package of claim 1, wherein the clearance wall member protrudes from the internal surface of the wafer member and forms a tapered shape.

5. The wafer level package of claim 1, wherein the element wall member enclosing the circuit element has a prismatic shape.

6. The wafer level package of claim 1, wherein the circuit element is connected to the element wall member.

7. The wafer level package of claim 1, wherein the circuit element corresponds to a bulk acoustic wave (BAW) resonator.

8. The wafer level package of claim 1, wherein the element section is spaced apart from the adjacent element section by two element wall member thicknesses and one clearance wall length.

9. The wafer level package of claim 1, wherein the clearance wall is disposed between adjacent clearance sections.

10. A wafer level package comprising:
    a first wafer and a second wafer with a vertical space therebetween;
    first wall members that allocate a portion of the vertical space as element sections, the element sections each comprising one or more circuit elements, and each element section spaced apart from an adjacent element section by a horizontal channel space between external surfaces of the first wall members; and
    second wall members, each extending from a first wall member across the horizontal channel space between adjacent element sections to an adjacent first wall member of the adjacent element section to divide a portion of the horizontal channel space external to the element sections into clearance sections isolated each from the other.

11. The wafer level package of claim 10, wherein the portion of the horizontal channel space external to the element sections comprises a clearance area on a device wafer where no circuit elements are disposed.

12. The wafer level package of claim 10, wherein the first wall members hermetically seal each element section, and the second wall members seal each clearance section.

13. The wafer level package of claim 10, wherein at least a portion of the first wall members and at least a portion of the second wall members are formed integrally with either the first wafer or the second wafer.

14. The wafer level package of claim 10, wherein
    a first portion of the first wall members and a first portion of the second wall members are formed to protrude from the first wafer;

a second portion of the first wall members and a second portion of the second wall members are formed to protrude from the second wafer; and the first portion of the first wall members and the first portion of the second wall members are, respectively, bonded to the second portion of the first wall members and the second portion of the second wall members to seal the element sections and the clearance sections.

15. The wafer level package of claim 10, wherein the first wall members and the second wall members define element wall members and clearance wall members, respectively.

16. The wafer level package of claim 10, wherein the first wafer comprises a device wafer and the second wafer comprises a cap wafer.

17. The wafer level package of claim 10, wherein each second wall is disposed between adjacent clearance sections.

18. A semiconductor device, comprising:

a circuit element disposed on a device substrate;

an element wall member extending vertically between the device substrate and a cap substrate and enclosing an element section in which the circuit element is disposed; and a clearance wall member extending horizontally from an external surface of the element wall member, wherein the clearance wall member comprises a portion protruding from the device substrate or the cap substrate.

* * * * *